United States Patent
Yoshida et al.

(10) Patent No.: US 6,978,429 B2
(45) Date of Patent: Dec. 20, 2005

(54) LOGIC SIMULATION APPARATUS FOR PERFORMING LOGIC SIMULATION IN HIGH SPEED

(75) Inventors: Akira Yoshida, Tokyo (JP); Masanori Kurimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 257 days.

(21) Appl. No.: 10/700,670

(22) Filed: Nov. 5, 2003

(65) Prior Publication Data

US 2004/0107086 A1   Jun. 3, 2004

(30) Foreign Application Priority Data

Dec. 2, 2002 (JP) .............................. 2002-350118

(51) Int. Cl.[7] ............................................. G06F 17/50
(52) U.S. Cl. ................................. 716/6; 716/5; 716/18
(58) Field of Search ........................... 716/4–6, 11, 18; 703/15, 19

(56) References Cited

U.S. PATENT DOCUMENTS 6,442,741 B1 * 8/2002 Schultz ........................ 716/6
6,567,962 B2 * 5/2003 Baumgartner et al. ......... 716/6
6,643,836 B2 * 11/2003 Wheeler et al. .............. 716/18
6,668,362 B1 * 12/2003 McIlwain et al. .............. 716/5

FOREIGN PATENT DOCUMENTS

| JP | 6-243190 | 9/1994 |
| JP | 8-22486 | 1/1996 |
| JP | 9-73475 | 3/1997 |
| JP | 2001-22808 | 1/2001 |

* cited by examiner

Primary Examiner—Paul Dinh
(74) Attorney, Agent, or Firm—Leydig, Voit & Mayer, Ltd.

(57) ABSTRACT

A logic simulation apparatus is provided with a circuit dividing unit (6) that selects and defines logic cones each of which carries out a logic operation in synchronization with one clock domain as target portions to be speeded up from logic cones extracted by a logic cone extracting unit (5), and that defines logic cones each of which carries out a logic operation based on a plurality of clock domains as nontarget portions not to be speeded up, and a logic compressing unit (7) that compresses the logic of each of the target portions, and performs a logic simulation on each of the target portions whose logic is compressed and also on performs a logic simulation on each of the nontarget portions.

7 Claims, 5 Drawing Sheets

LOGIC SIMULATION APPARATUS FOR PERFORMING LOGIC SIMULATION IN HIGH SPEED

BACKGROUND OF THE INVENTION

1. Field of the Invention

The present invention relates to a logic simulation apparatus for verifying the logic operation of a semiconductor integrated circuit in which a plurality of logic cells are connected.

2. Description of Related Art

A prior art logic simulation apparatus can shorten the time required for simulation by dividing the whole of target circuitry into some circuit portions according to the types of operation clocks, and by performing a simulation on each of the divided circuit portions with a necessary clock (see Japanese patent application publication (TOKKAIHEI) No. 9-73475 (column numbers [0025] to [0052] and FIG. 1)).

A problem encountered with a prior art logic simulation apparatus constructed as mentioned above is that because even if the target for simulation is a partial circuit that carries out a logic operation in synchronization with one clock domain, the prior art logic simulation apparatus verifies the logic of the partial circuit without neglecting occurring events, as in the case of a partial circuit that carries out a logic operation based on a plurality of clock domains, it takes much time to verify the logic of the partial circuit.

SUMMARY OF THE INVENTION

The present invention is proposed to solve the above-mentioned problem, and it is therefore an object of the present invention to provide a logic simulation apparatus that can shorten the time required for verification of the logic of target circuitry by neglecting events occurring in partial circuits each of which carries out a logic operation in synchronization with one clock domain.

In accordance with the present invention, there is provided a logic simulation apparatus including a defining unit for selecting and defining, as target portions to be speeded up, logic cones each of which carries out a logic operation in synchronization with one clock domain from among logic cones extracted by an extracting unit, and for defining logic cones each of which carries out a logic operation based on a plurality of clock domains as nontarget portions not to be speeded up, a logic compressing unit for compressing a logic of each of the target portions, and a verification unit for performing a logic simulation on each of the target portions whose logic is compressed by the logic compressing unit, and for performing a logic simulation on each of the nontarget portions.

As a result, the logic simulation apparatus can shorten the time required for verification of the logic of target circuitry by omitting events occurring in partial circuits each of which carries out a logic operation in synchronization with one clock domain.

Further objects and advantages of the present invention will be apparent from the following description of the preferred embodiments of the invention as illustrated in the accompanying drawings.

DETAILED DESCRIPTION OF THE PREFERRED EMBODIMENTS

The invention will now be described with reference to the accompanying drawings.

Embodiment 1.

Figure 1:
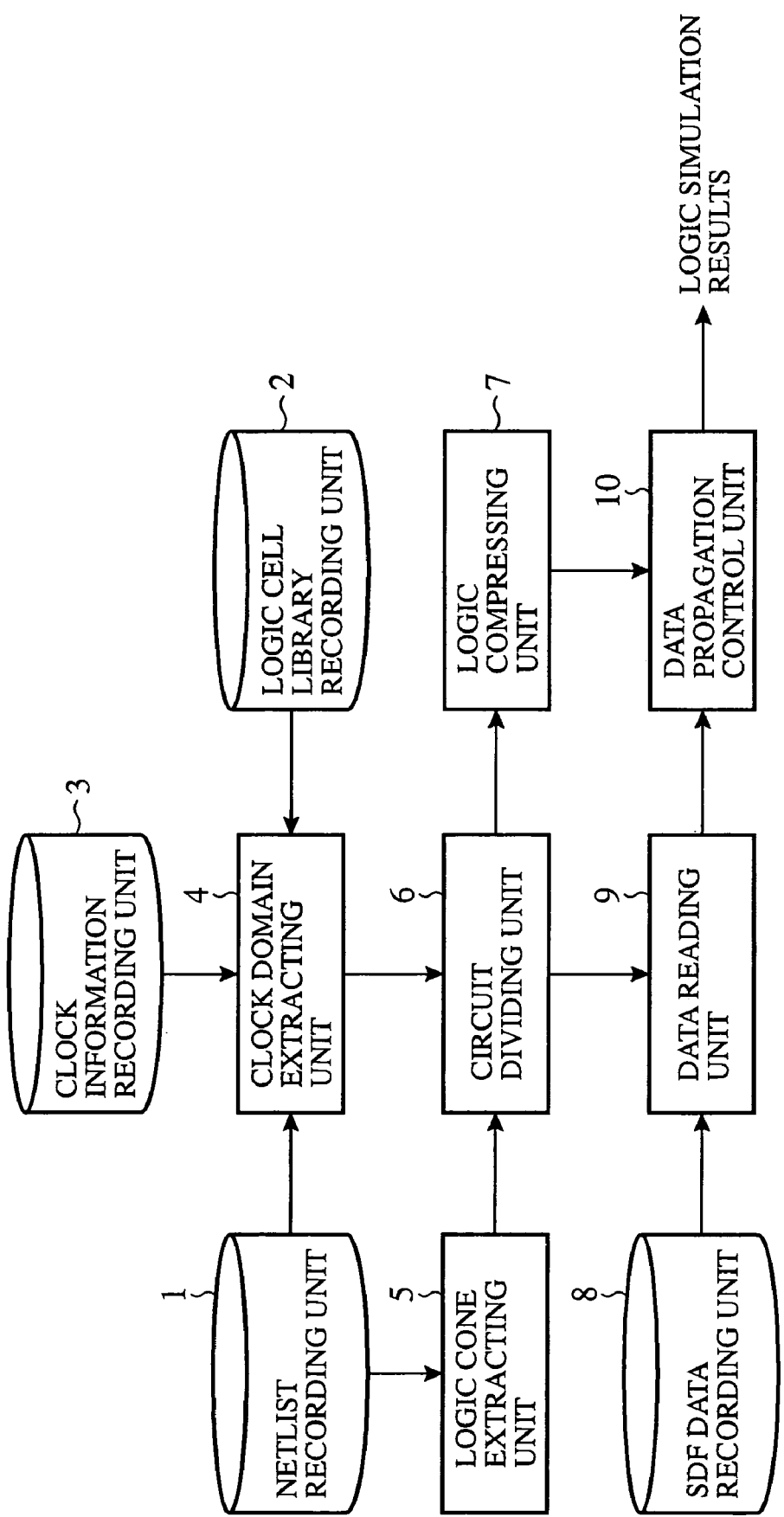
FIG. 1 is a block diagram showing the structure of a logic simulation apparatus according to embodiment 1 of the present invention.

FIG. 1 is a block diagram showing the structure of a logic simulation apparatus according to embodiment 1 of the present invention. In the figure, a netlist recording unit 1 records a netlist representing connections among logic cells, a logic cell library recording unit 2 records a delay caused by each logic cell and modeling to be referred when performing a timing check, in addition to a logic operation of each logic cell, and a clock information recording unit 3 records information about clocks input to a semiconductor integrated circuit whose logic is to be verified by the logic simulation apparatus according to embodiment 1 of the present invention.

A clock domain extracting unit 4 extracts clock domains in the netlist by referring to the recorded contents of each of the plurality of recording units 1 to 3. In the case where the target to be verified is a semiconductor integrated circuit of FIG. 3, the clock domain extracting unit 4 extracts a clock ClkA and a clock ClkB as clock domains. For example, when a frequency-divided clock, a frequency-multiplied clock, and a gating clock exist for ClkA, the clock domain extracting unit 4 extracts the set of the clock ClkA, the frequency-divided clock, the frequency-multiplied clock, and the gating clock as one clock domain. A logic cone extracting unit 5 extracts logic cones from the netlist recorded in the netlist recording unit 1. An extracting means includes the clock domain extracting unit 4 and the logic cone extracting unit 5.

A circuit dividing unit 6 selects and defines logic cones each of which carries out a logic operation in synchronization with one clock domain, as target portions to be speeded up, from among the logic cones extracted by the logic cone extracting unit 5, and also defines logic cones each of which carries out a logic operation based on a plurality of clock domains as nontarget portions not to be speeded up, so as to divide the semiconductor integrated circuit into a set of target portions to be speeded up and a set of nontarget portions not to be speeded up. The circuit dividing unit 6 constitutes a defining means. A logic compressing unit 7 compresses the logic of each target portion to be speeded up defined by the circuit dividing unit 6 (i.e., a transition of the logic of each logic cone that is a target portion to be speeded up). The logic compressing unit 7 constitutes a logic compressing means.

Figure 2:
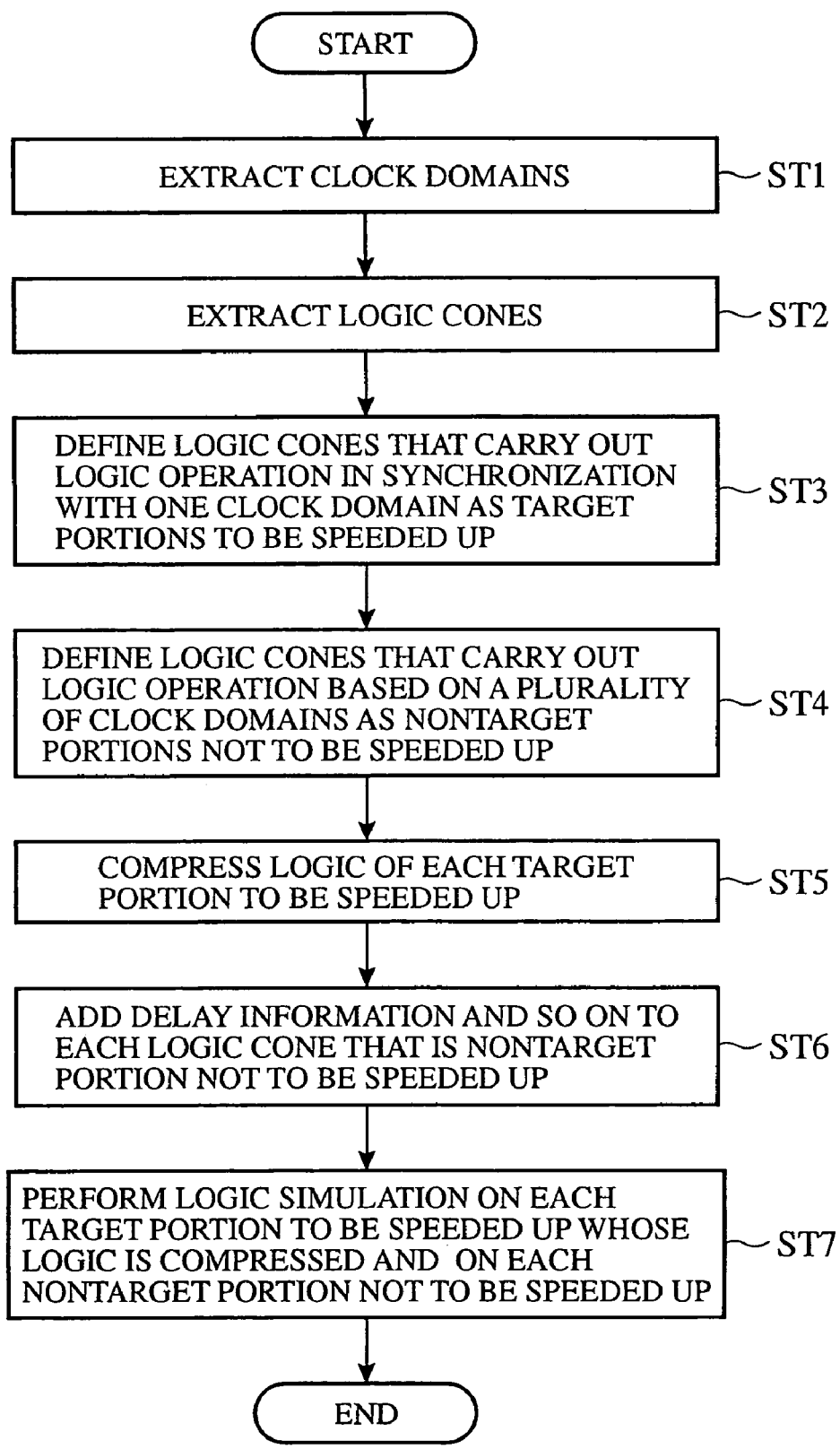
FIG. 2 is a flow chart showing processing performed by the logic simulation apparatus according to embodiment 1 of the present invention.

An SDF data recording unit 8 records delay information and timing check information corresponding to the netlist recorded in the netlist recording unit 1. A data reading unit 9 reads the delay information or timing check information recorded in the SDF data recording unit 8, and adds the delay information or timing check information to each of the plurality of logic cones that are defined, as nontarget portions not to be speeded up, by the circuit dividing unit 6. A data propagation control unit 10 performs a logic simulation on each of the plurality of target portions to be speeded up after the logic compressing unit 7 compresses the logic of each of the plurality of target portions to be speeded up, and also performs a logic simulation on each of the plurality of nontarget portions not to be speeded up to which the delay information or timing check information is added by the data reading unit 9. A verification means includes the SDF data recording unit 8, the data reading unit 9, and the data propagation control unit 10. FIG. 2 is a flow chart showing processing performed by the logic simulation apparatus according to embodiment 1 of the present invention.

Next, a description will be made as to an operation of the logic simulation apparatus according to embodiment 1 of the present invention. First of all, the clock domain extracting unit 4 extracts clock domains in the netlist by referring to the recorded contents of each of the plurality of recording units 1 to 3 (in step ST1). In the case where the target to be verified is a semiconductor integrated circuit of FIG. 3, the clock domain extracting unit 4 extracts a clock ClkA and a clock ClkB as clock domains.

The logic cone extracting unit 5 extracts logic cones from the netlist recorded in the netlist recording unit 1 (in step ST2). In other words, the logic cone extracting unit 5 defines, as start points, primary inputs (Reset, PIA1, PIA2, PIB1, ClkA, ClkB) and the data output points (A1/Q, A2/Q, A3/Q, B1/Q, B2/Q) of logic cells (e.g., flip-flop cells and latch cells), and also defines, as end points, a primary output (POB1) and the data input points of logic cells (e.g., D and S of A1, A3 and B2, and D and T of A2 and B1). The logic cone extracting unit 5 then extracts a logical path from each of the plurality of start points to each of the plurality of end points and integrates each set of logical paths reaching the same end point as a logic cone.

Concretely, the logic cone extracting unit 5 extracts the following logic cones.
Logic cone L1: PIA1→A1/D
Logic cone L2: Reset→A1/S
Logic cone L3: PIA2→A2/D
Logic cone L4: PIB1→B1/D
Logic cone L5: A1/Q and A2/Q→A3/D
Logic cone L6: A2/Q→A3/S
Logic cone L7: A3/Q and B1/Q→B2/D
Logic cone L8: A1/Q→B2/S
Logic cone L9: B2/Q→POB1

When the logic cone extracting unit 5 extracts the plurality of logic cones L1 to L9 from the netlist, the circuit dividing unit 6 selects and defines the logic cones L1, L3, L4, L5, and L9 each of which carries out a logic operation in synchronization with the single clock domain ClkA (or ClkB), as target portions to be speeded up, from among the plurality of logic cones L1 to L9 (in step ST3). On the other hand, the circuit dividing unit 6 defines the remaining logic cones L2, L6, L7, and L8 each of which carries out a logic operation based on the plurality of clock domains ClkA and ClkB as nontarget portions not to be speeded up. The circuit dividing unit 6 further defines a logical path from the clock domain ClkA to A1/T, A2/T, and A3/T and a logical path from the other clock domain ClkB to B1/T and B2/T as nontarget portions not to be speeded up, as follows (in step ST4).
Clock signal S1: ClkA→A1/T, A2/T, and A3/T
Clock signal S2: ClkB→B1/T and B2/T When the circuit dividing unit 6 thus divides the semiconductor integrated circuit into the set of target portions to be speeded up and the set of nontarget portions not to be speeded up, the logic compressing unit 7 compresses the logic of each of the plurality of target portions to be speeded up so that the logic can propagate when one event occurs by changing each of the logic cones L1, L3, L4, L5, and L9 that are target portions to be speeded up to a Boolean expression (in step ST5). For example, in the case of the logic cone L5, the logic compressing unit 7 compresses the logic C1 on the way of the corresponding logical path (assume that the logic C1 consists of tens of AND gates and OR gates that are cascaded) so as to create a Boolean expression assignment statement by which the logic propagates from A1/Q and A2/Q to A3/D when one event occurs.

When the circuit dividing unit 6 divides the semiconductor integrated circuit into the set of target portions to be speeded up and the set of nontarget portions not to be speeded up, the data reading unit 9 reads the delay information or timing check information recorded in the SDF data recording unit 8 and adds the delay information or timing check information to each of the logic cones L2, L6, L7, and L8 that are defined, as nontarget portions not to be speeded up, by the circuit dividing unit 6 (in step ST6). The data reading unit 9 also adds the delay information or timing check information to each of the clock signals S1 and S2 that are nontarget portions not to be speeded up.

Furthermore, when a target portion to be speeded up and a nontarget portion not to be speeded up are adjacent to each other (in FIG. 3, in the logic cell A3 the logic cone L5 that is a target portion to be speeded up is adjacent to the logic cone L7 that is a nontarget portion not to be speeded up, and in the logic cell A1 the logic cone L1 that is a target portion to be speeded up is adjacent to the logic cone L2 that is a nontarget portion not to be speeded up), the data reading unit 9 adds the following information to the nontarget portion not to be speeded up. For example, in the case where the logic cones L5 and L7 that a target portion to be speeded up and a nontarget portion not to be speeded up, respectively, are adjacent to each other in the logic cell A3, because the logic cone L7 that is a nontarget portion not to be speeded up is connected to the data output point Q (i.e., an end point) of the logic cell A3, the data reading unit 9 adds only the delay information of the logic cell A3 to the logic cone L7. In the case where the logic cones L1 and L2 that are a target portion to be speeded up and a nontarget portion not to be speeded up, respectively, are adjacent to each other in the logic cell A1, because the logic cone L2 that is a nontarget portion not to be speeded up is connected to the data input point (i.e., a start point) S of the logic cell A1, the data reading unit 9 adds only the timing check information of the logic cell A1 to the logic cone L2.

When the logic compressing unit 7 compresses the logic of each of the plurality of target portions to be speeded up, the data propagation control unit 10 performs a logic simulation on each of the plurality of target portions to be speeded up whose logic is compressed. The data propagation control unit 10 further performs a logic simulation on each of the plurality of nontarget portions not to be speeded up to which the delay information or timing check information is added by the data reading unit 9 (in step ST7).

In the logic simulation of each target portion to be speeded up, for transferring a logical value from a certain logic cone to another logic cone at the next stage, scheduling processing is carried out so as to avoid data omissions depending on a delay of the clock path. In other words, when clocks reach all start points of each target portion to be speeded up, the scheduling processing is carried out. As an alternative, at a certain start point the data propagation control unit 10 evaluates data to be recorded at an end point and carries out the scheduling processing immediately before a new clock reaches. After that, the data propagation control unit 10 records data at the end point again when a clock reaches the end point.

Next, a description will be made as to a case where data (A1/Q, A2/Q) from the logic cells A1 and A2 of FIG. 3 pass through the combinational logic C1 and then enter the logic cell A3 as a concrete example of the operation of a "target portion to be speeded up". When the clock domain ClkA reaches the logic cell A2 and then reaches the logic cell A1, the data propagation control unit 10 determines a logical evaluation value of the combinational logic C1 from the data A1/Q and A2/Q, i.e., data A3/D to be temporarily recorded in the logic cell A3 because it can be assumed that clocks reach all the start points of the target portion to be speeded up. Then, when the clock domain ClkA reaches the logic cell A3, the data propagation control unit 10 writes the data in A3/D of the logic cell A3.

In the logic simulation of each nontarget portion not to be speeded up, like a prior art logic simulation apparatus, the logic simulation apparatus carries out consecutive scheduling processing while creating events in consideration of each of the plurality of logic cells, the delay information and so on of each of the plurality of logic cells.

As can be seen from the above description, in accordance with this embodiment 1, the logic simulation apparatus is provided with the circuit dividing unit 6 that selects and defines logic cones each of which carries out a logic operation in synchronization with one clock domain as a set of target portions to be speeded up from among logic cones extracted by the logic cone extracting unit 5, and that defines logic cons each of which carries out a logic operation based on a plurality of clock domains as a set of nontarget portions not to be speeded up, and the logic compressing unit 7 that compresses the logic of each target portion to be speeded up defined by the circuit dividing unit 6, and performs a logic simulation on each target portion to be speeded up whose logic is compressed and also performs a logic simulation on each nontarget portion not to be speeded up. As a result, the logic simulation apparatus can neglect events occurring in each target portions to be speeded up and can therefore shorten the time required for verification of the logic of each target portion to be speeded up.

Furthermore, in accordance with this embodiment 1, the logic simulation apparatus defines, as start points, primary inputs and the data output points of logic cells, also defines, as end points, primary outputs and the data input points of the logic cells, extracts a logical path from each of the plurality of start points to each of the plurality of end points, and integrates each set of logical paths reaching the same end point as a logic cone. As a result, the logic simulation apparatus can extract logic cones from the netlist without causing the complication of the structure thereof.

In addition, in accordance with this embodiment 1, when a target portion to be speeded up and a nontarget portion not to be speeded up are adjacent to each other in a logic cell, and the nontarget portion not to be speeded up is connected to the data output point of the logic cell, the logic simulation apparatus performs a logic simulation on the nontarget portion not to be speeded up in consideration of the delay information about a delay caused by the logic cell. As a result, even when the nontarget portion not to be speeded up is connected to the data output point of the logic cell, the logic simulation apparatus can perform the logic simulation with a high degree of accuracy.

Furthermore, in accordance with this embodiment 1, when a target portion to be speeded up and a nontarget portion not to be speeded up are adjacent to each other in a logic cell, and the nontarget portion not to be speeded up is connected to the data input point of the logic cell, the logic simulation apparatus performs a logic simulation on the nontarget portion not to be speeded up in consideration of the timing check information about the logic cell. As a result, even when the nontarget portion not to be speeded up is connected to the data input point of the logic cell, the logic simulation apparatus can perform the logic simulation with a high degree of accuracy.

Embodiment 2.

Figure 4:
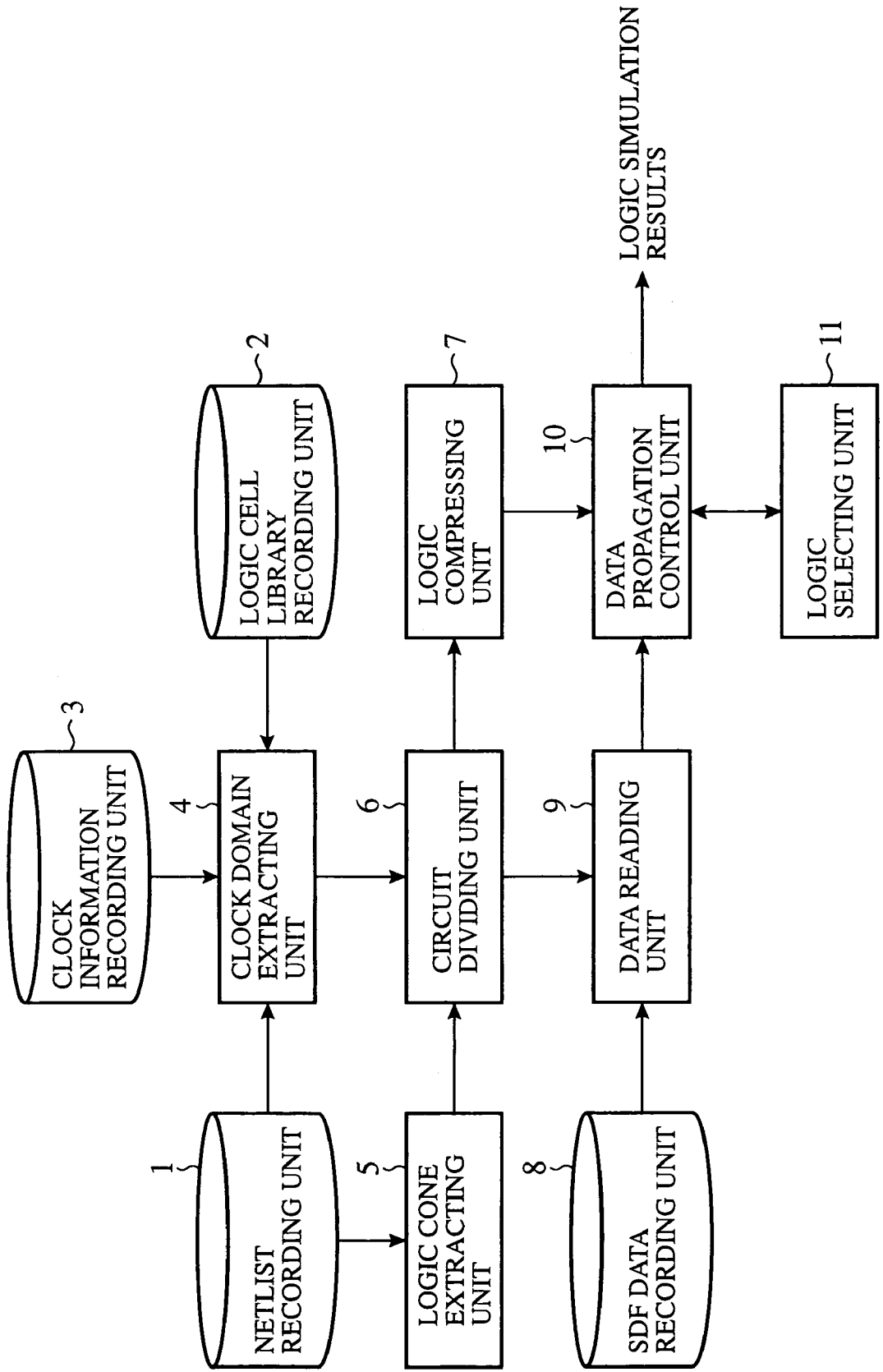
FIG. 4 is a block diagram showing the structure of a logic simulation apparatus according to embodiment 2 of the present invention.

FIG. 4 is a block diagram showing the structure of a logic simulation apparatus according to embodiment 2 of the present invention. In the figure, because the same reference numerals as shown in FIG. 1 denote the same components as those of the first embodiment or like components, the explanation of those components will be omitted hereafter. When a data propagation control unit 10 performs a logic simulation on each target portion to be speeded up and also performs a logic simulation on each nontarget portion not to be speeded up, if a certain logic cell receives data from a target portion to be speeded up and data from a nontarget portion not to be speeded up, a logic selecting unit 11 determines the output value of the logic cell in consideration of the logic of each of those data. The logic selecting unit 11 constitutes a verification means.

Although no mention is made in above-mentioned embodiment 1, when a logic cell A3 receives data from a logic cone L5 that is a target portion to be speeded up and receives data from a logic cone L6 and a clock signal S1 that are nontarget portions not to be speeded up, for example, the logic selecting unit 11 determines the output value of the logic cell A3 in consideration of the logic of each of those data.

Concretely, the logic selecting unit 11 determines the output value of the logic cell A3 as follows. For example, assume that "1" is input to a primary pin Reset, "1" is input to a primary pin PIA1, and "0" is input to a primary pin PIA2. When a clock domain ClkA changes from "0" to "1" and the clock ("0"→"1") reaches A2/T of a logic cell A2, and, after that, the clock ("0"→"1") reaches A1/T of a logic cell A1, that is, when clock events reach all clock trees connected to the clock domain ClkA, a value that is scheduled to be recorded in the logic cell A3 according to a procedure of processing data for target portions to be speeded up is assigned to A3/D of the logic cell A3.

At this time, as the value assigned to A3/D, the output value of the logic C1 which is evaluated by using "1" input to the primary pin PIA1 and "0" input to the primary pin PIA2 is not used, but a value scheduled beforehand is used. Then, the output value of the logic C1 which is evaluated by using "1" input to the primary pin PIA1 and "0" input to the primary pin PIA2 is scheduled to be assigned to A3/D of the logic cell A3 in preparation for the next clock event.

When data "1" is scheduled to be assigned to A3/S of the logic cell A3 and data "0" has not reached A3/S of the logic cell A3, the logic selecting unit 11 makes the logic cell A3 deliver the value that has been assigned to A3/D of the logic cell A3, as previously mentioned, from A3/Q thereof every time when a clock reaches A3/T of the logic cell A3. When data "0" reaches A3/S of the logic cell A3 according to the data processing procedure for nontarget portions not to be speeded up after a delay time (i.e., a delay time of A2/Q→A3/S), the logic selecting unit 11 makes the logic cell A3 deliver a fixed value "1" from A3/Q thereof.

In accordance with this embodiment 2, when the data propagation control unit 10 performs a logic simulation on each target portion to be speeded up and also performs on each nontarget portion not to be speeded up, if a certain logic cell receives data from a target portion to be speeded up and data from a nontarget portion not to be speeded up, the logic selecting unit 11 determines the output value of the logic cell in consideration of the logic of each of those data. As a result, even when there exists a logic cell that receives data from a target portion to be speeded up and data from a nontarget portion not to be speeded up, the logic simulation apparatus can perform logic simulations with a high degree of accuracy.

Embodiment 3.

Figure 5:
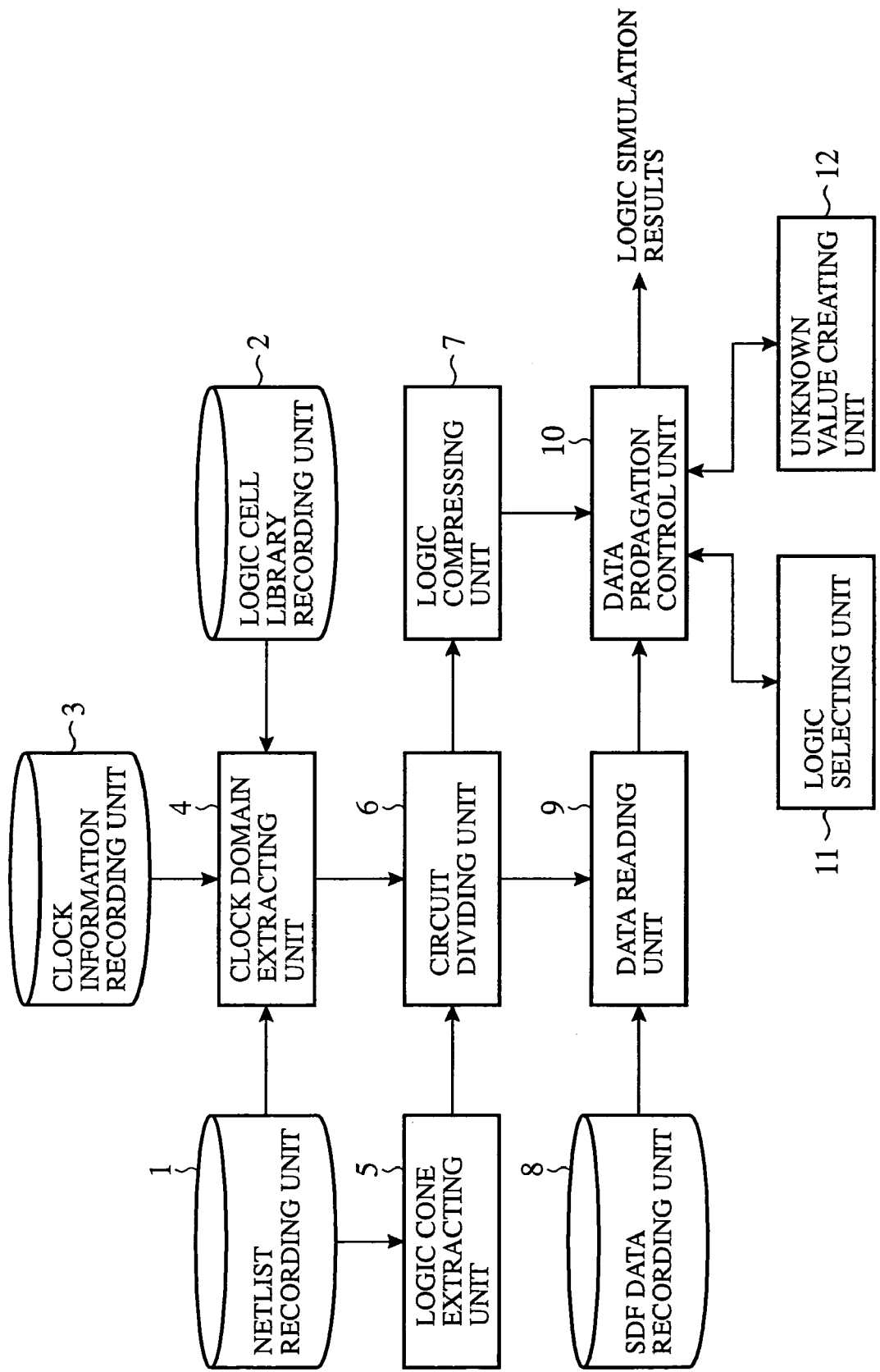
FIG. 5 is a block diagram showing the structure of a logic simulation apparatus according to embodiment 3 of the present invention.

FIG. 5 is a block diagram showing the structure of a logic simulation apparatus according to embodiment 3 of the present invention. In the figure, because the same reference numerals as shown in FIG. 4 denote the same components as those of the second embodiment or like components, the explanation of those components will be omitted hereafter. When a data propagation control unit 10 performs a logic simulation on each target portion to be speeded up and also performs a logic simulation on each nontarget portion not to be speeded up, if a certain logic cell receives data from a target portion to be speeded up and data from a nontarget portion not to be speeded up, an unknown value creating unit 12 performs a timing check on each of those data and assigns an unknown value to an output value of the logic cell when detecting the occurrence of a timing violation. The unknown value creating unit 12 constitutes a verification means.

In accordance with above-mentioned embodiment 2, when a certain logic cell receives data from a target portion to be speeded up and data from a nontarget portion not to be speeded up, the logic selecting unit 11 determines the output value of the logic cell in consideration of the logic of each of those data, as mentioned above. In contrast, when a certain logic cell receives data from a target portion to be speeded up and data from a nontarget portion not to be speeded up, the unknown value creating unit 12 of this embodiment performs a timing check on each of those data and assigns an unknown value to the output value of the logic cell when detecting the occurrence of a timing violation.

Figure 3:
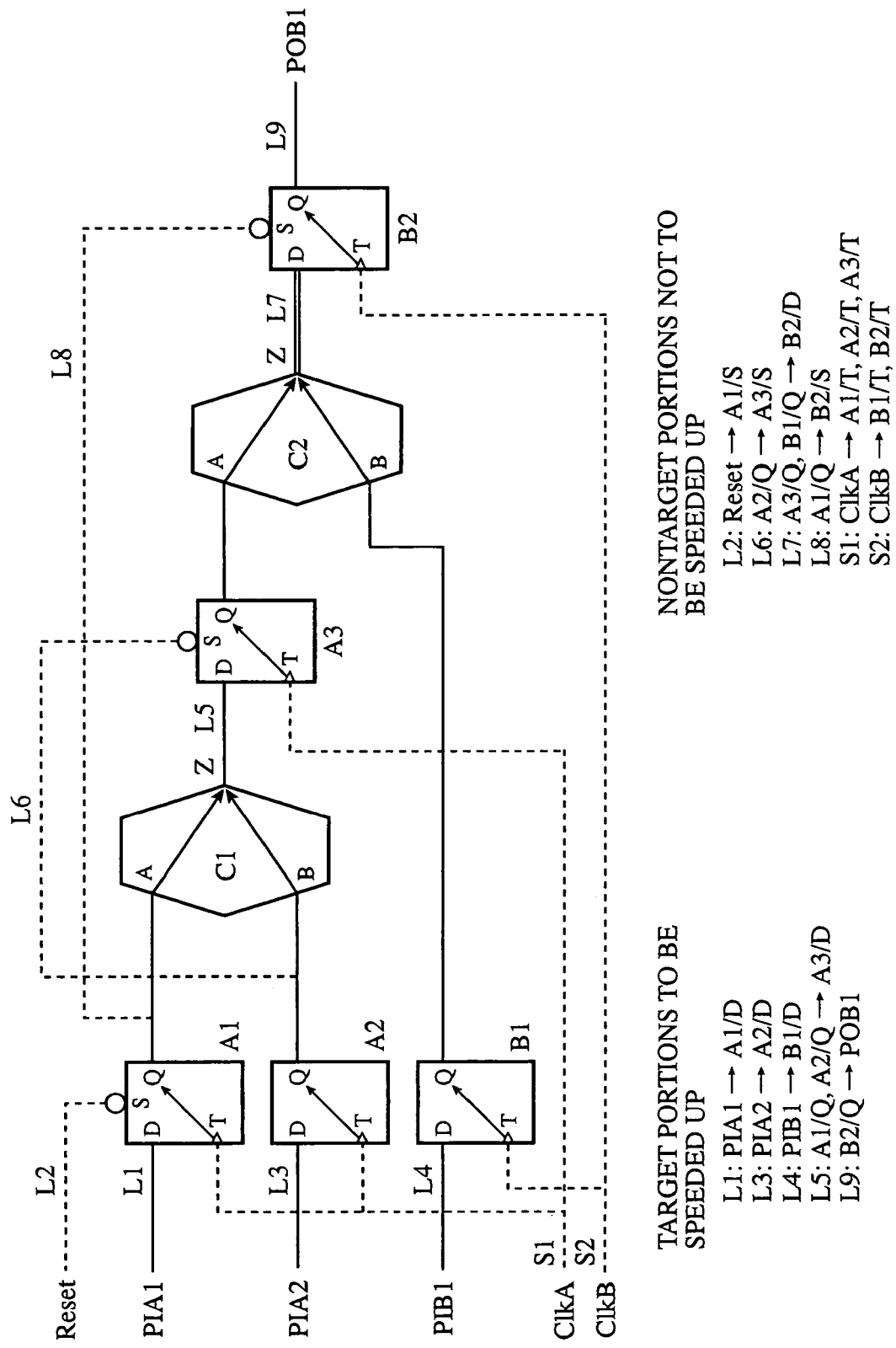
FIG. 3 is circuit diagram showing an example of a semiconductor integrated circuit in which a plurality of logic cells are connected.

For example, when data "0" reaches A3/S of a logic cell A3 of FIG. 3, and the logic selecting unit 11 then makes the logic cell A3 deliver a fixed value "1" from A3/Q thereof, the unknown value creating unit 12 compares data at A3/S of the logic cell A3 with data at A3/T of the logic cell A3. The unknown value creating unit 12 then performs a recovery check and a removal check, and, when determining that a recovery error occurs, makes the logic cell A3 deliver an unknown value "X" from A3/Q thereof. In contrast, when determining that a removal error occurs, the unknown value creating unit 12 performs the following processing.

When a removal error occurs before clock events reach all clock trees connected to a clock domain ClkA, the unknown value creating unit 12 makes the logic cell A3 deliver an unknown value "X" from A3/Q thereof. On the other hand, when a removal error occurs before clock events reach all clock trees connected to the clock domain ClkA, the unknown value creating unit 12 schedules to assign an unknown value "X" to the logic cell A3 so as to assign it to A3/Q of the logical cell A3 when the next clock event occurs. In this case, a value created by logical compression is output only in the next cycle. However, no value (reset and set) from a direct signal is output, and the assigning of an unknown value "X" to the logic cell A3 is scheduled again.

In accordance with this embodiment 3, when the data propagation control unit 10 performs a logic simulation on each target portion to be speeded up and also performs a logic simulation on each nontarget portion not to be speeded up, if a certain logic cell receives data from a target portion to be speeded up and data from a nontarget portion not to be speeded up, the unknown value creating unit 12 performs a timing check on each of those data and assigns an unknown value to the output value of the logic cell when detecting the occurrence of a timing violation. As a result, the logic simulation apparatus can identify logic cells in which a timing violation occurs.

Many widely different embodiments of the present invention may be constructed without departing from the spirit and scope of the present invention. It should be understood that the present invention is not limited to the specific embodiments described in the specification, except as defined in the appended claims.

What is claimed is:

1. A logic simulation apparatus comprising:
   extracting means for extracting clock domains and logic cones from a netlist representing connections among logic cells;
   defining means for selecting and defining, as target portions to be speeded up, logic cones each of which carries out a logic operation in synchronization with one clock domain from the logic cones extracted by said extracting means, and for defining logic cones each of which carries out a logic operation based on a plurality of clock domains as nontarget portions not to be speeded up;
   logic compressing means for compressing a logic of each of the target portions; and
   verification means for performing a logic simulation on each of the target portions whose logic is compressed by said logic compressing means, and for performing a logic simulation on each of the nontarget portions.

2. The logic simulation apparatus according to claim 1, wherein said verification means performs the logic simulation on each of the nontarget portions in consideration of at least one of (i) delay information about delays caused by the logic cells and delays caused by wires among the logic cells, and (ii) timing check information.

3. The logic simulation apparatus according to claim 1, wherein said extracting means defines, as start points, primary inputs and data output points of the logic cells, also defines, as endpoints, primary outputs and data input points of the logic cells, extracts a logical path from each of the start points to each of the end points, and integrates logical paths reaching an identical end point as one of the logic cones.

4. The logic simulation apparatus according to claim 3, wherein said verification means performs a logic simulation on one of the nontarget portions adjacent to one of the target portions and connected to the data output point of one of the logic cells in consideration of the delay information about a delay caused by said one of the logic cells.

5. The logic simulation apparatus according to claim 3, wherein said verification means performs a logic simulation on one of the nontarget portions adjacent to one of the target portions and connected to the data input point of one of the logic cells in consideration of the timing check information about said one of the logic cells.

6. The logic simulation apparatus according to claim 1, wherein when performing a logic simulation on each of the target portions to be speeded up and also performing a logic simulation on each of the nontarget portions not to be speeded up, said verification means determines an output value of one of the logic cells receiving input data from the target portion and the nontarget portion in consideration of a logic value of each of the input data received by said one of the logic cells.

7. The logic simulation apparatus according to claim 1, wherein when performing a logic simulation on each of the target portions to be speeded up and also performing a logic simulation on each of the nontarget portions not to be speeded up, said verification means performs a timing check on each of data input from the target portion and the nontarget portion to one of the logic cells and assigns an unknown value to an output value of said one of the logic cells when detecting occurrence of a timing violation.

* * * * *